United States Patent
Luedeke et al.

(10) Patent No.: US 9,246,478 B2
(45) Date of Patent: Jan. 26, 2016

(54) ELECTRONIC DEVICE AND METHOD FOR GENERATING CLOCK SIGNALS WITH AND WITHOUT FREQUENCY JITTER FOR ONE SOURCE CLOCK SIGNAL GENERATED BY A SINGLE NARROW-BAND SOURCE CLOCK SIGNAL

(71) Applicants: Thomas Henry Luedeke, Oberbergkirchen (DE); Joseph Circello, Phoenix, AZ (US)

(72) Inventors: Thomas Henry Luedeke, Oberbergkirchen (DE); Joseph Circello, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 47 days.

(21) Appl. No.: 14/209,095

(22) Filed: Mar. 13, 2014

(65) Prior Publication Data
US 2015/0263709 A1    Sep. 17, 2015

(51) Int. Cl.
*H03K 3/84*    (2006.01)

(52) U.S. Cl.
CPC .......................................... *H03K 3/84* (2013.01)

(58) Field of Classification Search
CPC ....................................................... H03K 3/84
USPC .............................. 327/164, 291, 295; 331/78
See application file for complete search history.

(56) References Cited

U.S. PATENT DOCUMENTS

| 6,687,319 | B1 | 2/2004 | Perino et al. |
| 8,847,653 | B2 * | 9/2014 | Hong et al. ................... 327/291 |
| 2009/0135885 | A1 | 5/2009 | Lin |

OTHER PUBLICATIONS

Kim, J. et al., "Dithered Timing Spread Spectrum Clock Generation for Reduction of Electromagnetic Radiated Emission from High-speed Digital System," IEEE International Symposium on Electromagnetic Compatibility, vol. 1, Aug. 19-23, 2002; pp. 413-418.

Zhou, J. et al., "A Synchronization-Free Spread Spectrum Clock Generation Technique for Automotive Applications," IEEE Transactions on Electromagnetic Compatibility, vol. 53, No. 1, Feb. 2011, 9 pages.

Ko, J. et al., "Spread Spectrum Clock Generator for reducing Electro-Magnetic Interference (EMI) Noise in LCD Driver IC," 50th Midwest Symposium on Circuits and Systems, Aug. 5-8, 2007; pp. 1106-1109.

* cited by examiner

*Primary Examiner* — William Hernandez

(57) ABSTRACT

The present application suggests an electronic device and method for generating clock signals with and without frequency jitter for one source clock signal generated by a single narrow-band source clock signal. The device comprises a random number generator to generate a random number signal varying in time which represents a divisor fraction signal; a signal mixer to mix the timely varying random number signal and a clock divisor signal and to output a mixed divisor signal; and a fractional clock divider to generate an output clock signal from a source clock signal, wherein the output clock signal has a frequency $f_{out}(t)$, which is substantially equal to the frequency $f_{source}$ of the source clock signal being a narrow-band clock signal divided by a divisor $D(t)$ represented by the mixed divisor signal.

20 Claims, 5 Drawing Sheets

US 9,246,478 B2

ELECTRONIC DEVICE AND METHOD FOR GENERATING CLOCK SIGNALS WITH AND WITHOUT FREQUENCY JITTER FOR ONE SOURCE CLOCK SIGNAL GENERATED BY A SINGLE NARROW-BAND SOURCE CLOCK SIGNAL

FIELD OF THE INVENTION

This invention relates to an electronic device and a method for generating clock signals with and without frequency jitter for one source clock signal generated by a single narrow-band source clock signal.

BACKGROUND OF THE INVENTION

Reducing the electromagnetic emission is still a major concern in a wide field of applications including in particular electronic circuitries to be used in electromagnetic emission sensitive environments such as automotive applications and aviation applications. All electronic systems emit some unwanted radio frequency energy. Emitted energy may cause any unwanted interference in particular within tightly packed integrated circuits or electronic circuits arranged nearby. The emitted noise generally appears at sharp spectral peaks usually at the operating frequency of the device, and a few harmonics thereof. The problem of radio-frequency emission and interference caused thereby gets further worse in view of microprocessors and microcontrollers as well as communication interfaces required to operate at high frequencies in order to meet performance requirements and.

A system designer can use a spread-spectrum clock signal generator such as a spread-spectrum PLL to reduce interference by spreading the energy over a larger portion of the spectrum. For example, by changing the operating frequency up and down by a small amount (about 1%), a device running at e.g. hundreds of megahertz can spread its interference evenly over a few megahertz of spectrum, which drastically reduces the emitted energy at a given frequency. Frequency modulation of a clock signal is a well-known and efficient way to spread clock harmonics around a center frequency, thus reducing emitted narrow-band RF energy.

For instance US 2009/0135885 A1 suggests a spread spectrum clock generator which makes use of a random number generator, which controls a voltage-controlled oscillator, in a phase-locked loop (PLL) circuit. The U.S. Pat. No. 6,687,319 B1 suggests a use of a random number generator to randomly gate off individual clock cycles generated by a crystal oscillator. A reference clock signal is transmitted in parallel, which allows reconstructing the off-gated clock cycles. The clock signal with gated-off clock cycles is spectrum-spread and may be provided as a high power signal, whereas the reference clock signal is provided as low power signal causing less narrow-band emission.

Further examples of spread spectrum clock generators are suggested in "Dithered Timing Spread Spectrum Clock Generation for Reduction of Electromagnetic Radiated Emission from High-speed Digital System", Jonghoon Kim et al, Electromagnetic Compatibility, 2002; "Spread Spectrum Clock Generator for reducing Electro-Magnetic Interference (EMI) Noise in LCD Driver IC", Jaehong Ko et al, Circuits and Systems, 2007; and "A Synchronization-Free Spread Spectrum Clock Generation Technique for Automotive Applications", Junfeng Zhou et al, IEEE Transactions On Electromagnetic Compatibility, Vol. 53, No. 1, February 2011. The spread spectrum clock generators suggested in the above mentioned scientific articles use selectable delay lines to shift edges of the clock signal in accordance with predefined functional relationships.

Some communication interfaces such as inter-chip communication protocols do not tolerate variations of the frequency of a clock signal such as those variations generated by the above mentioned spread spectrum clock generators. Hence, one or more additional unmodulated clock signal generators such as narrow-band PLLs are used to generate the clock signals for the inter-chip communication and/or peripherals connected through communication interfaces. The implementation of additional clock generator circuits is expensive with regard to the required die area and power to operate the additional clock generator circuits.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the drawings are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
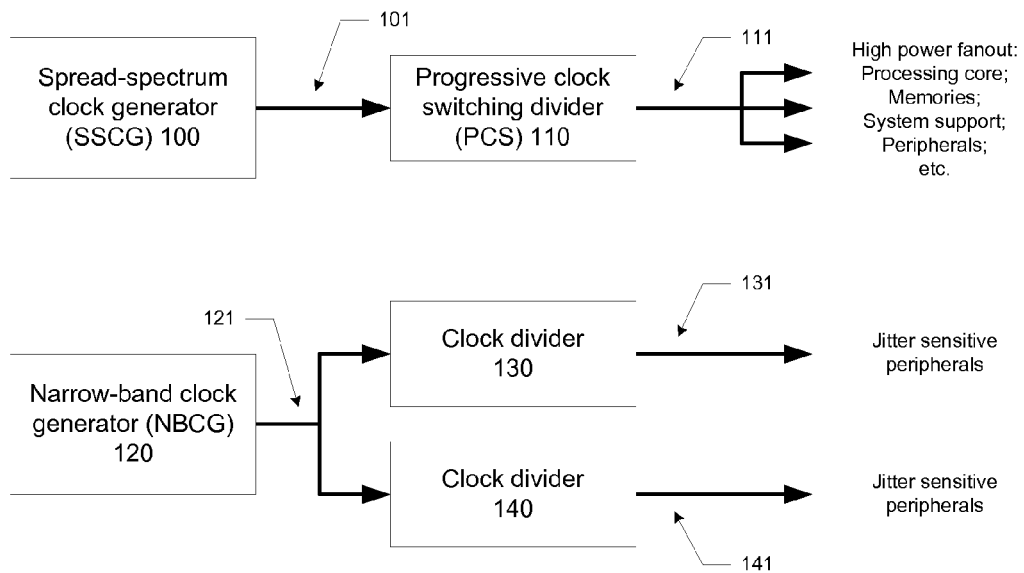
FIG. 1 schematically illustrates a state of the art implementation of clock signals within electronic circuits.

FIG. 1 schematically illustrates clock signal generation required in an electronic device according to the state of the art. In known electronic devices the clock signal generation takes account of the RF emission and interference problematic mentioned above in that clock signals, being provided at high signal strengths, have a frequency spectrum, which is spread at a predetermined width. Such spectrum-spread clock signals may meet the requirement of electromagnetic emission limitation and the jitter of the spectrum-spread clock signals is adjusted to the limiting conditions defined by the electronic circuitries to which the spectrum-spread clock signals are supplied. However, such spectrum-spread clock signals may not be applicable to be used in communication with jitter-sensitive peripherals. The clock signal generation comprises at least one separate clock generator, which provides a narrow-band low-jitter clock signal meeting the requirements and more strict limiting conditions of such jitter-sensitive peripherals.

Therefore, an electronic device of the state of the art comprises at least two clock signal generators, at least one spread-spectrum clock generator (SSCG) 100 and at least one narrow-band clock generator (NBCG) 120. The SSCG 100 may be for instance a frequency-modulated PLL (phase-locked loop) circuit with a jitter amplitude $A_{mod}$ of approximately 0.5% to 2.5% of the center frequency $f_c$ of the PLL circuit, wherein $$f_{max} = f_c \cdot (1 + A_{mod}) \text{ and}$$

$$f_{min} = f_c \cdot (1 - A_{mod}).$$

The spectrum-spread clock signal 101 generated by the SSCG 100 has substantially a mean frequency $f_{SSCG}$. The spectrum-spread clock signal 101 may be supplied to a clock divider or a progressive clock switching (PCS) divider 110, which generates an output clock signal 111 with a frequency $f_{out}$ substantially equal to the mean frequency $f_{SSCG}$ divided by a divisor D. The divisor may be dynamically adapted and may be also non-integer.

The narrow-band clock generator (NBCG) 120 may be for instance a PLL circuit with low jitter (without frequency modulation), wherein low jitter should be understood in relationship to the jitter of spread-spectrum clock generators used in electronic circuitries.

The narrow-band clock signal 121 generated by the NBCG 120 has substantially a frequency $f_{NBCG}$. The narrow-band clock signal 121 may be supplied to one or more clock dividers 130, 140, which generate clock signals 131, 141 with the desired frequencies $f_{out1}$, $f_{out2}$ by applying the divisors $D_1$ and $D_2$. For the sake of illustration, it should be assumed that the divisors $D_1$ and $D_2$ differ from each other.

Electronic components like clock dividers, fractional clock dividers, progressive clock switchers, etc. are applicable to generate clock signals with different frequencies from a source clock signal. Fractional clock dividers allows for applying integer and non-integer divisors and progressive clock switchers further allow for stepwise adjusting the divisor to a target value.

Typical electronic devices in which the above illustrated clock signal generation is used, are for instance microprocessors, microcontrollers and system-on-chips having various independently clocked domains and communication interfaces requiring clock signals for communication.

Figure 2:
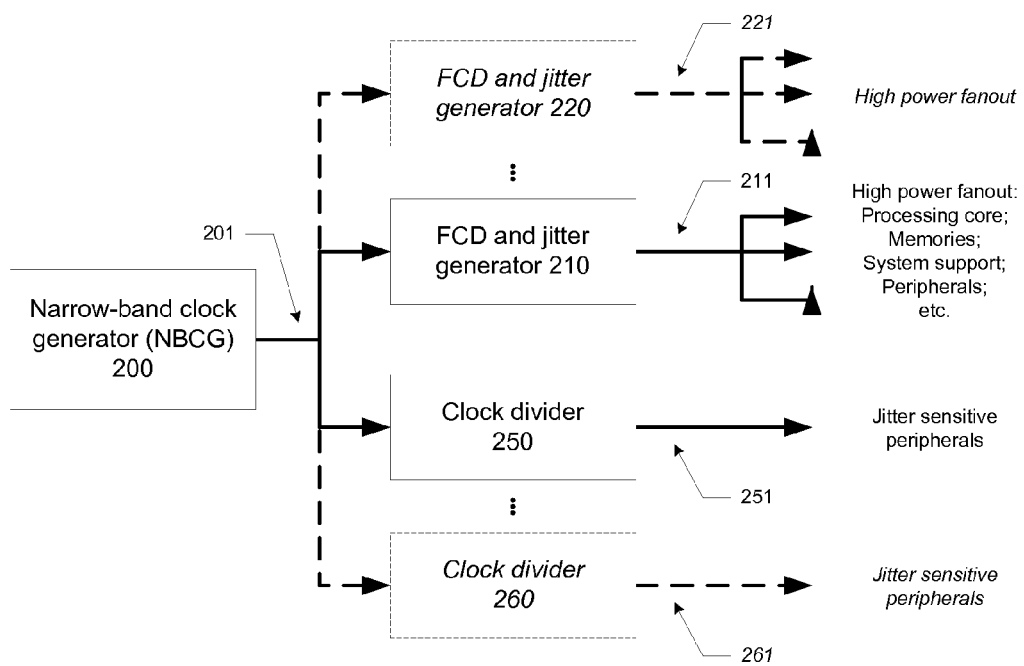
FIG. 2 schematically illustrates a clock signal generation circuit according to an embodiment of the present invention.

FIG. 2 schematically illustrates a clock signal generation circuit according to an embodiment of the present invention, which is applicable to replace the above illustrated clock signal generation required in an electronic device, in particular in the outlined use cases.

A common narrow-band clock signal 201 is for instance provided by a common narrow-band clock generator 200 such as for instance a PLL circuit with low jitter (without frequency modulation). The common narrow-band clock signal 201 having a frequency $f_{source}$ is supplied to at least one fractional clock divider with jitter generator 210 and at least one clock divider 250. It should be understood that the common narrow-band clock signal 201 may be supplied to one or more fractional clock dividers with jitter generators 210, 220 and to one or more clock dividers 250, 260. The one or more fractional clock divider with jitter generators 210, 220 may be understood to form a (spread-spectrum) branch of the clock signal generation circuit according to an embodiment of the present invention, which provides one or more spread-spectrum clock signals 211, 221 with mean frequencies $f_{out1,SS}$, $f_{out2,SS}$. In particular, the one or more spread-spectrum clock signals 211, 221 may be high power or high energy clock signals, which reduces the electromagnetic emission thereof. The one or more spread-spectrum clock signals 211, 221 may for instance be provided to processor cores, memory interfaces and the like. The one or more clock dividers 250, 260 may be understood to form a narrow-band branch of the clock signal generation circuit according to an embodiment of the present invention, which provides narrow-band clock signals 251, 261 with frequencies $f_{out1,NB}$, $f_{out2,NB}$.

Each of the fractional clock dividers and clock dividers may apply different divisors to generate the respective outputted clock signals 211, 221, 251 and 261 but two or more divisors of the dividers may be also (substantially) equal. One or more dividers of the exemplarily illustrated clock dividers 250, 260 of the narrow-band branch may be fractional clock dividers.

The frequency $f_{source}$ of the common narrow-band clock signal 201 is selected to allow for deriving the different spread-spectrum clock signals 211, 221 with mean frequencies $f_{out1,SS}$, $f_{out2,SS}$ and narrow-band clock signals 251, 261 with frequencies $f_{out1,NB}$, $f_{out2,NB}$ from it. This means that the frequency $f_{source}$ of the common narrow-band clock signal 201 is at least (substantially) equal to the clock signal with the highest frequency of the clock signals comprising the spread-spectrum clock signals 211, 221 with mean frequencies $f_{out1,SS}$, $f_{out2,SS}$ and the narrow-band clock signals 251, 261 with frequencies $f_{out1,NB}$, $f_{out2,NB}$.

Figure 3:
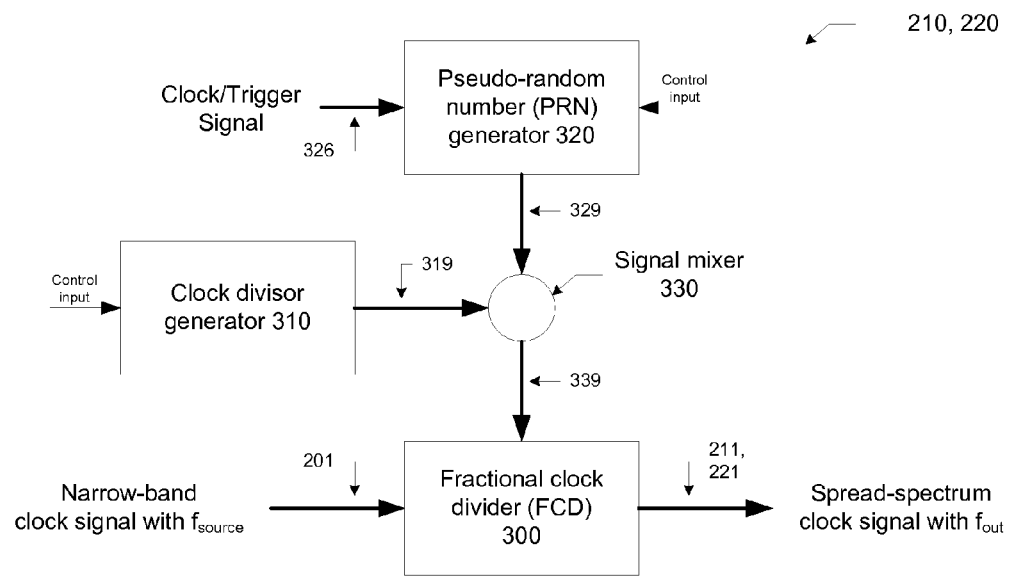
FIG. 3 schematically illustrates a fractional clock divider and jitter generator according to an embodiment of the present invention.

FIG. 3 schematically illustrates a fractional clock divider and jitter generator according to an embodiment of the present invention. The fractional clock divider and jitter generator 210, 220 comprises a pseudo-random number (PRN) generator 320, a clock divisor generator 310, a signal mixer 330 and a fractional clock divider (FCD) 300.

The common narrow-band clock signal 201 with the frequency $f_{source}$ is inputted into the FCD 300. Further, the FCD 300 is supplied with a divisor signal 339, which is formed of a predetermined divisor signal 319 generated by the clock divisor generator 310 and a divisor-varying signal 329, which is derived from a pseudo-random number (PRN) generated by the pseudo-random number generator 320.

The PRN generator 320 is clocked by a clock signal, timer signal or any other trigger signal 326, which is in particular cyclic in time and more particularly periodic in time. Hence, the PRN generator 320 supplies a sequence of pseudo-random numbers (PRN) over time.

A signal mixer 330 combines the predetermined divisor signal 319 and the divisor-varying signal 329. The divisor-varying signal 329 is small in relationship to the predetermined divisor signal 319, which means that the divisor-varying signal 329 represents a fraction of the divisor signal 339 supplied by the signal mixer 330 to the FCD 300. The divisor represented by the predetermined divisor signal 319 will be denoted D and the divisor represented by the divisor-varying signal 329 varying in time will be denoted Δ(t) in the following. The output clock signal generated by the FCD 300 when applying only the divisor D of the predetermined divisor signal 319 has a frequency $f_{out,mean}$, wherein $$f_{out,mean} = \frac{f_{source}}{D}.$$

The signal mixer 330 combines the divisor D represented by the predetermined divisor signal 319 and the time-varying divisor fraction Δ(t) represented by the divisor-varying signal 329 forming a time-varying divisor D(t), wherein $$D(t)=f(D,\Delta(t)).$$

For instance, the signal mixer 330 may be an additive mixer, which means that $$D(t) = f(D, \Delta(t))$$
$$= \frac{D}{a} + \frac{\Delta(t)}{b},$$

wherein $$a + b = 1.$$

Further, the signal mixer 330 may be a product mixer, which means that $$D(t)=f(D,\Delta(t))=D\cdot\Delta(t).$$

The output clock signal 211, 221 generated by the FCD 300 applying the time-varying divisor D(t) supplied by the signal mixer 330 to the FCD 300 has a frequency $f_{out}$, wherein $$f_{out} = f_{out}(t)$$
$$= \frac{f_{source}}{D(t)}$$

Accordingly, it is understood that the frequency $f_{out}(t)$ of the output clock signal generated by the FCD 300 varies over time, which results in a clock signal with frequency spectrum spreading having a defined width. The width of the spread frequency spectrum is determined by the time-varying divisor D(t) in relationship with the divisor D. Accordingly, the spread of the width is determined by the minimum and maximum values of the time-varying divisor D(t) in relationship with the divisor D.

The clock divisor generator 310 may be provided with control terminals for inputting and/or outputting control instructions and information, respectively. For instance, the divisor D of the clock divisor generator 310 may be adjustable.

The PRN generator 320 may be provided with control terminals for inputting and/or outputting control instructions and information, respectively. For instance, control input may be applied to supply an initial seed and/or to reset the PRN generator 320.

Moreover, the signal mixer 330 may be provided with control terminals for inputting and/or outputting control instructions and information, respectively. For instance, mixing parameters for the functional relationship applied to mix the input signals may be configurable through control inputs.

Figure 4:
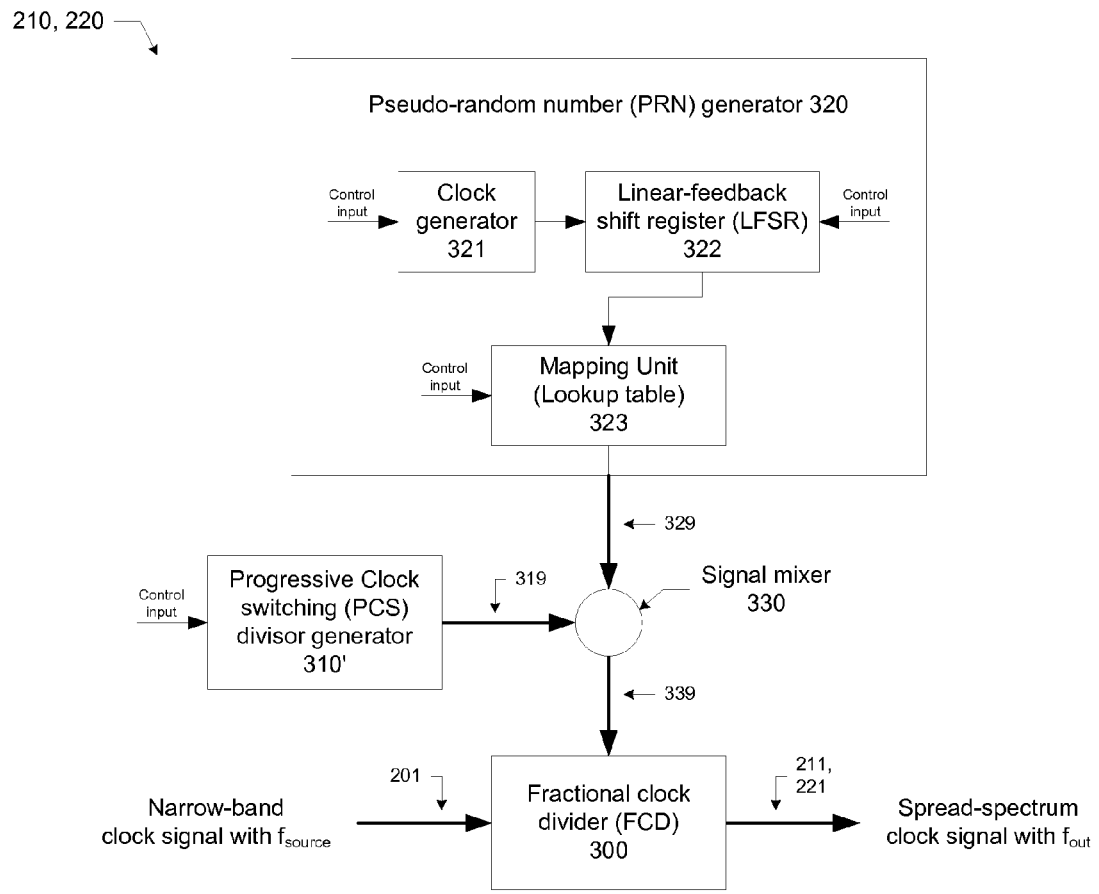
FIG. 4 schematically illustrates a fractional clock divider and jitter generator according to a further embodiment of the present invention.

FIG. 4 schematically illustrates the fractional clock divider and jitter generator according to another embodiment of the present invention. In this embodiment, a progressive clock switching (PCS) divisor generator 310' is exemplarily comprised for generating the divisor D and supplying divisor D the represented by as predetermined divisor signal 319 an input signal to the signal mixer 330. The PCS divisor generator 310' allows for stepwise adjusting the divisor D starting from an initial value $D_I$ to a target value $D_T$. The width of the steps and the period may be configurable through control terminals of the PCS divisor generator 310' for inputting and/or outputting control instructions and information, respectively.

In this embodiment, the PRN generator 320 further comprises a clock generator 321 for clocking a linear-feedback shift register (LFSR) 322. The clock generator 321 within the PRN generator generates the aforementioned clock signal 326, which triggers the generation of a new pseudo-random number over time. The clock generator 321 may be provided with control terminals for inputting and/or outputting control instructions and information, respectively. For instance, control input may enable to configure the frequency of the clock signal generated by the clock generator 321.

The content of the individual register bits of the LFSR 322 represents and is interpreted as random number. A mapping unit 323 may be arranged at the random number output of the LFSR 322 and allows for mapping the range of the domain of the random number to a predetermined value range. The mapping unit 323 may for instance comprise a lookup table, which assigns to each input value an output value. The mapping unit 323 may be provided with control terminals for inputting and/or outputting control instructions and information, respectively. For instance, the parameters and/or the mapping function may be configurable through control inputs thereof.

The remaining components schematically illustrated in FIG. 4 have been described above. In order to omit unnecessary repetitions, reference is made thereto. Nevertheless, it should be noted that the linear-feedback shift register described above is to be understood as merely one example of a pseudo-random number generating circuit, to which the present invention is not limited. Other pseudo-random number generators such as linear congruential generators and lagged Fibonacci generators may be also used.

Figure 5:
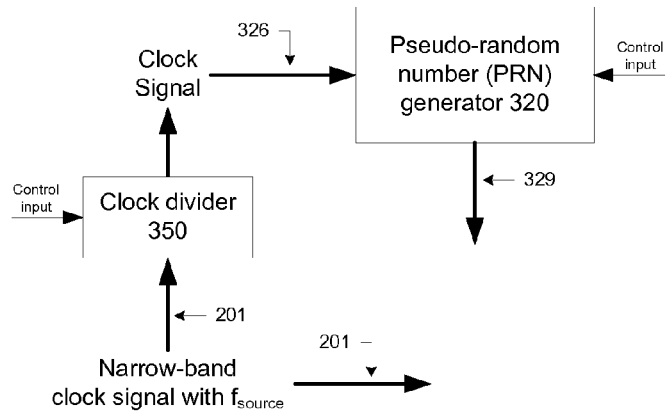
FIG. 5 schematically illustrates a part of the fractional clock divider and jitter generator according to an embodiment of the present invention.

FIG. 5 schematically illustrates a part of the fractional clock divider and jitter generator according to another embodiment of the present invention. In particular, the schematic block diagram schematically illustrates an embodiment for providing a clock signal 326 to the PRN generator 320. It should be noted that the schematic illustration of FIG. 5 is limited thereto. The clock signal 326 may be derived from the narrow-band clock signal with frequency $f_{source}$, which is the source clock signal 201 inputted to the fractional clock divider and jitter generator according to an embodiment of the present invention. In order to provide a clock signal 326 to the PRN generator 320 with a predefined frequency, a clock divider 350 or a fractional clock divider may be provided to generate a clock signal 326 having a lower frequency than the source clock signal 201. Such (fractional) clock divider 350 may be configurable through control terminals.

For the sake of understanding, it should be noted that the embodiments described above in particular with reference to FIGS. 2 to 5 should not be interpreted as separate embodiments of the present invention. On the contrary thereto, teaching made in conjunction with one embodiment may be transferred to other embodiments. For instance, the clock signal generation as described with reference to FIG. 5 may be used in conjunction with the fractional clock divider and jitter generator embodied with reference to FIGS. 3 and 4, respectively. Analogously, the mapping unit (lookup table) 323 and/or PSC divisor generator 310' embodied with reference to FIG. 4 may be used in conjunction with the fractional clock divider and jitter generator embodied with reference to FIG. 3.

Further it should be noted that although the above description referred to a pseudo-random number generator adapted to generate the divisor fraction Δ(t) and to provided the divisor-varying signal 329 it should be understood that the present invention is not limited thereto. Any random number generator may be likewise used to generate the divisor fraction Δ(t) and to provided the divisor-varying signal 329.

Figure 6:
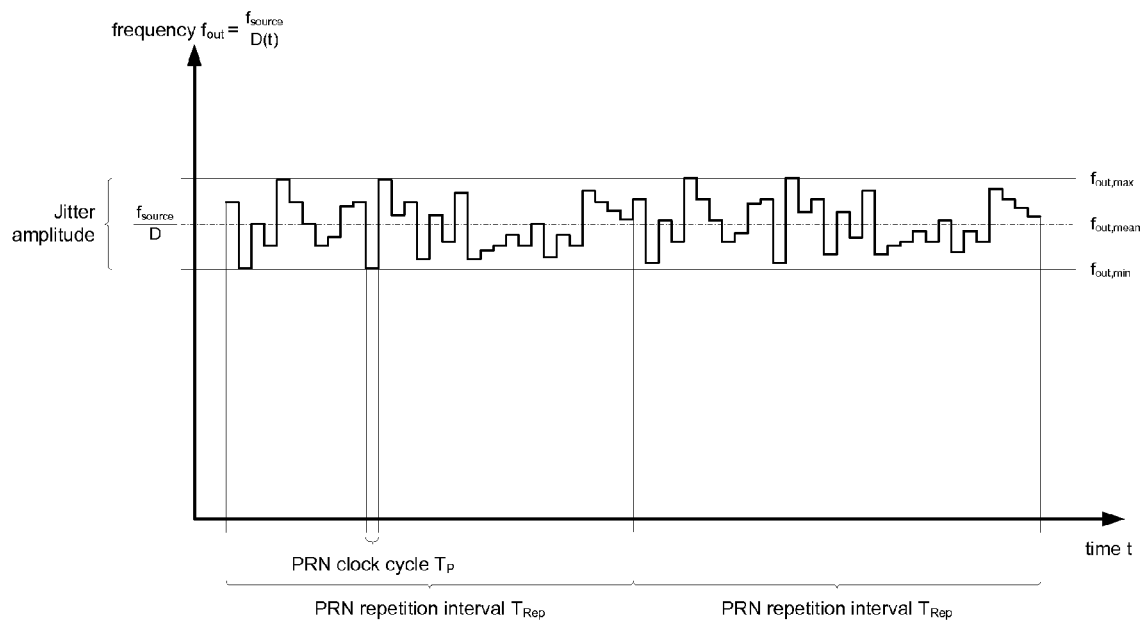
FIG. 6 shows a schematic plot of the output clock signal frequency over time of an example of the outputted clock signal of the fractional clock divider and jitter generator according to an embodiment of the present invention.
Figure 7:
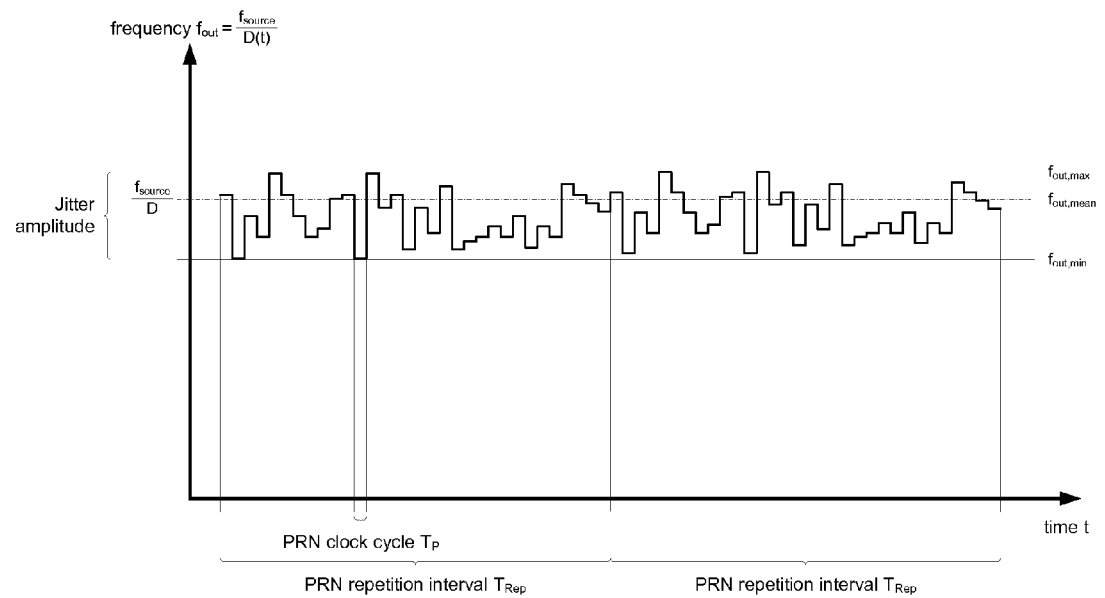
FIG. 7 shows a schematic plot of the output clock signal frequency over time of a further example of the outputted clock signal of the fractional clock divider and jitter generator according to an embodiment of the present invention.
Figure 8:
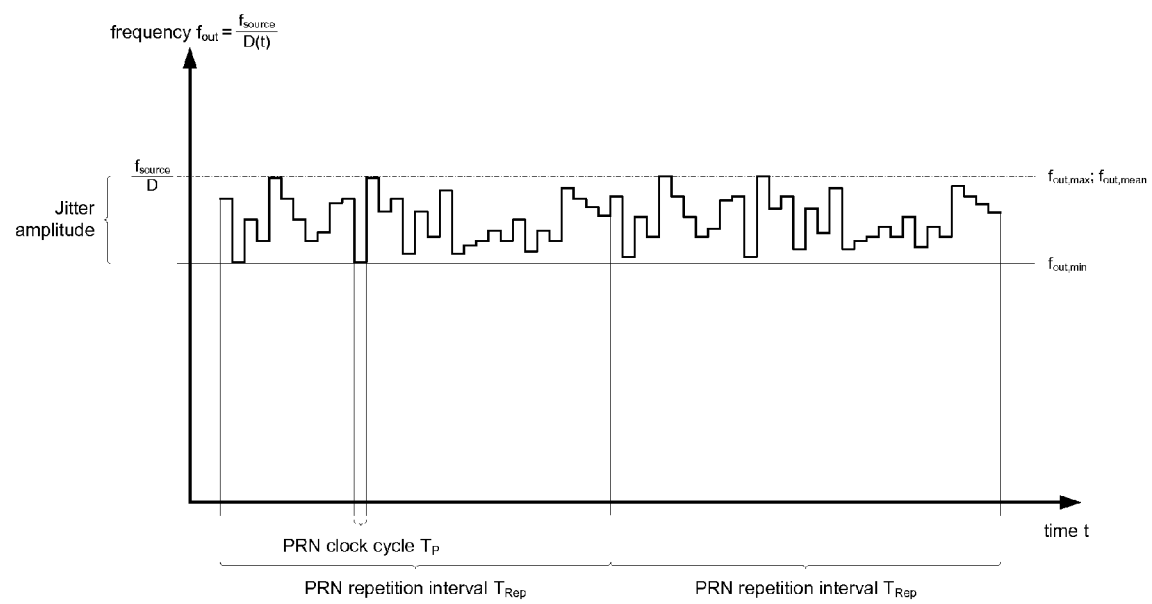
FIG. 8 shows a schematic plot of the output clock signal frequency over time of a further example of the outputted clock signal of the fractional clock divider and jitter generator according to an embodiment of the present invention.

The operation of the fractional clock divider and jitter generator according to embodiments of the present invention will be further described with respect to FIGS. 6 to 8, which show plots of the frequency over time of output clock signals, which can be by the fractional clock divider and jitter generators according to embodiments of the present invention.

As described above, the frequency of the output clock signal generated by the fractional clock divider and jitter generator according to an embodiment of the present invention is given by $$f_{out} = f_{out}(t)$$
$$= \frac{f_{source}}{D(t)},$$

wherein

D(t)=f(D,Δ(t)) mixed output signal generated by signal mixer 330;

D: predetermined divisor supplied by clock divisor generator 310, 310'; and Δ(t): pseudo-random divisor fraction generated/supplied by the PRN generator 320.

The output clock signal 211, 221 generated by the fractional clock divider 300 when applying only the divisor D of the predetermined divisor signal 319 has a frequency $f_{out,mean}$, wherein $$f_{out,mean} = \frac{f_{source}}{D},$$

is additionally indicated in the frequency plots of the output clock signals in FIGS. 6 to 8.

The frequency of the output clock signals varies between minimum values $f_{out,min}$ and maximum values $f_{out,max}$. The frequency variation is determined by the contribution of the pseudo-random divisor fraction Δ(t) generated by the PRN generator 320. A jitter amplitude may be defined from the minimum values $f_{out,min}$ and maximum values $f_{out,max}$ of the frequency $f_{out}(t)$ of the output clock signal, respectively. Accordingly, it is immediately understood that the spectrum of the output clock signals is spread across $\{f_{out,max} \leq f_{out} \leq f_{out,max}\}$. The variation in time of the pseudo-random divisor fraction Δ(t) is further indicated in the plots of FIGS. 6 to 8 as a periodic variation in time designated as PRN clock cycle interval $T_P$. The variation of the pseudo-random divisor fraction Δ(t) being periodic in time should be understood to be merely illustrative and the present invention should not be understood to be limited thereto.

Further for the sake of illustration, a repetition interval $T_{Rep}$ of the pseudo-random numbers is indicated, which is for instance known from sequences of pseudo-random numbers generated by a LFSR.

The frequency range (jitter amplitude) of the output clock signals, which may be defined by the minimum values $f_{out,min}$ and maximum values $f_{out,max}$ of the frequency $f_{out}(t)$ of the output clock signals, may be symmetric with respect to the frequency $f_{out,mean}$ as illustrated in FIG. 6, may be asymmetric with respect to the frequency $f_{out,mean}$ as illustrated in FIG. 7 or the frequency range of the output clock signals may be below the frequency $f_{out,mean}$ as illustrated in FIG. 8. Those skilled in the art will understand that although not illustrated in an exemplary plot, the frequency range of the output clock signals may be above the frequency $f_{out,mean}$.

Those skilled in the art will further understand on the basis of the description of the present invention that the frequency range (jitter amplitude) and the arrangement thereof with respect to the frequency $f_{out,mean}$ is defined by the divisor D, the pseudo-random divisor fraction Δ(t), the properties of the signal mixer and the properties of a mapping unit if used. Configuration and adjustment thereof allows for obtaining frequency range (jitter amplitude) of the output clock signal and the arrangement thereof with respect to the frequency $f_{out,mean}$.

Figure 9:
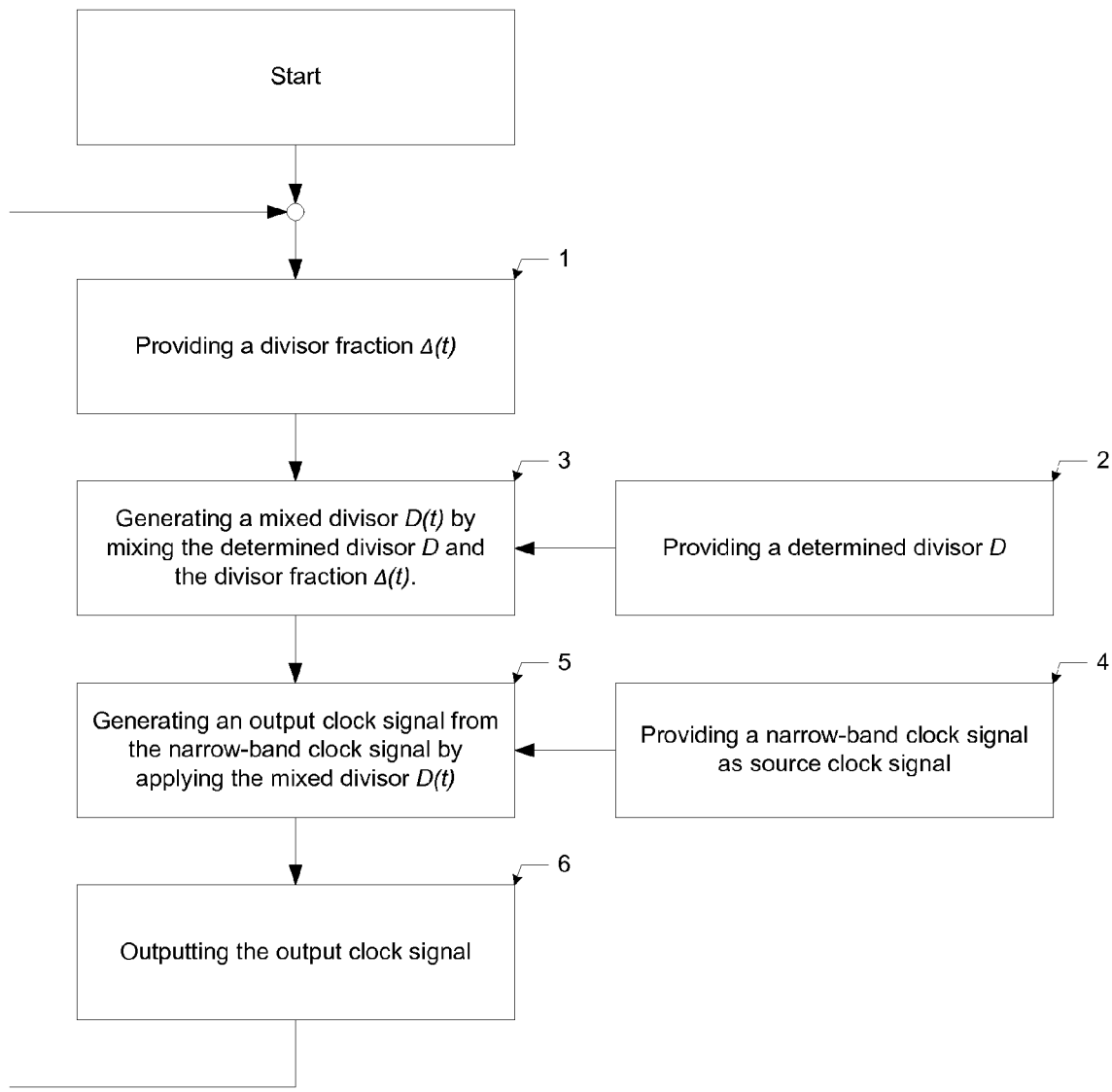
FIG. 9 shows a schematic flow chart, which illustrates the operation of the fractional clock divider and jitter generator according to embodiment of the present invention.

The operation of the fractional clock divider and jitter generator according to embodiment of the present invention as described above is further illustrated schematically by the exemplary flow chart shown in FIG. 9.

Block 1: Providing a divisor fraction Δ(t) varying in time generated by a random number generator, in particular a pseudo-random generator.

Block 2: Providing a determined divisor D by a clock divisor generator.

Block 3: Generating a mixed divisor D(t) varying in time by mixing the determined divisor D and the time-varying divisor fraction Δ(t). For instance, the mixing operation may be an addition operation of the input signal, each of which may be scaled by an individual parametric factor, or the mixing operation may be a multiplication operation of the input signal and an optional further scaling parameter.

Block 4: Providing a narrow-band clock signal as source clock signal to a fractional clock divider. The narrow-band clock signal is a clock signal with a low amount of jitter, which may for instance be generated by a PLL circuit. Such PLL circuits are implementable as highly-accurate clock generation circuits.

Block 5: Supplying the mixed divisor D(t) varying in time to the fractional clock divider. The fractional clock divider, which may be also designated as a fractional frequency divider or fractional clock divider (pre-)scaler, is a circuit which takes an input signal of a frequency $f_{in}$ and generates an output signal of a frequency:

$$f_{out} = \frac{f_{in}}{d},$$

wherein d is a real number (d ∈ ℝ).

Generating an output clock signal from the narrow-band clock signal by the fractional clock divider, the frequency of the output clock signal is substantially equal to the frequency of the inputted narrow-band clock signal divided by the mixed divisor D(t):

$$f_{out}(t) = \frac{f_{source}}{D(t)},$$

wherein

-continued $$D(t) = f(D, \Delta(t))$$

and $$D(t) \in \mathbb{R}.$$

Block 6: Providing the output clock signal as a frequency spectrum-spread clock signal to further circuits.

The operation of the fractional clock divider and jitter generator is continuous, at least as long as a source clock signal is supplied to the fractional clock divider.

It should be noted that the period of time variation of the divisor faction Δ(t) defines the period of time variation of the output clock signal. This period of time variation is adjustable through the triggering of the PRN generator 320, which generates and supplies a new pseudo-random number upon each trigger. As also exemplified with reference to FIG. 5, a clock signal may be used as a trigger signal triggering the PRN generator 320.

Further, it should be understood that the determined divisor D may be configurable and hence may vary during the operation of the fractional clock divider and jitter generator. For instance, the output clock signal should have a lower frequency to save power consumption of a clocked circuitry (cf. for instance low power operation (sleep) modes of digital circuitries). However, the time scale on which the determined divisor D is considered to vary is significantly longer than the time scale in which the divisor fraction Δ(t) varies. Accordingly, a variation of the determined divisor D in the intended use cases does not contribute to the frequency spectrum spreading of the output clock signal.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the narrow-band clock generator 200, the clock generator 321, the clock divisor generator 310, and/or the PCS divisor generator 310' may be external to the fractional clock divider and jitter generator.

Any arrangement of components to achieve the same functionality is effectively "associated"/"assigned" such that the desired functionality is achieved. Hence, any two components herein combined to achieve a particular functionality can be seen as "associated with"/"assigned to" each other such that the desired functionality is achieved, irrespective of architectures or intermedial components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, at least some or all components 320, 310, 330, and 300 of the fractional clock divider and jitter generator 210, 220 may be implemented as a single integrated circuit. Alternatively, the examples may be implemented as any number of separate integrated circuits or separate devices interconnected with each other in a suitable manner. For example, the components 320, 310, 330, and 300 of the fractional clock divider and jitter generator 210, 220 may be implemented as separate devices.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A clock signal generator comprising:
   a random number generator adapted to generate a random number signal varying in time in accordance with a trigger signal, wherein the timely varying random number signal defines a divisor fraction signal;
   a signal mixer adapted to mix a clock divisor signal and the timely varying random number signal to obtain a mixed divisor signal; and
   a fractional clock divider adapted to generate an output clock signal from a source clock signal, wherein the frequency of the output clock signal has a frequency, which is substantially equal to the frequency of a narrow-band clock signal, which is supplied to the fractional clock divider as the source clock signal, divided by a divisor represented by the mixed divisor signal.

2. The clock signal generator of claim 1,
   wherein the random number generator is provided with at least one signal output at which the random number signal is available;
   wherein the signal mixer is provided with at least two signal inputs and at least one signal output, wherein the at least one signal output of the random number generator is operatively coupled to one of the at least two signal inputs of the signal mixer for receiving the timely varying random number signal, wherein the signal mixer is adapted to receive the clock divisor signal through the other one of the at least two signal inputs of the signal mixer, wherein the mixed divisor signal is available through the at least one signal output of the signal mixer;
   wherein the fractional clock divider is provided with at least two signal inputs and the at least one signal output, wherein at least one signal output of the fractional clock divider is operatively coupled to the at least one signal output of the signal mixer for receiving the mixed divisor signal, wherein the fractional clock divider is adapted to receive the narrow-band clock signal through the other one of the at least two signal inputs of the fractional clock divider, wherein the output clock signal is available through the at least one signal output of the fractional clock divider.

3. The clock signal generator of claim 1, further comprising:
   a clock divisor generator adapted to generate the clock divisor signal, wherein the clock divisor generator is provided with at least one signal output, wherein the at least one signal output is operatively coupled to the signal mixer to supply the clock divisor signal thereto.

4. The clock signal generator of claim 3, wherein the clock divisor generator is a progressive clock switching divisor generator.

5. The clock signal generator of claim 1, wherein the random number generator is a pseudo-random number generator.

6. The clock signal generator of claim 5, wherein the pseudo-random number generator comprises a linear-feedback shift register.

7. The clock signal generator of claim 1, further comprising
   a timer for triggering the random number generator to generate a new pseudo-random number signal, wherein the timer is provided with at least one signal output, wherein the at least one signal output of the timer is operatively coupled to the random number generator to supply the trigger signal thereto.

8. The clock signal generator of claim 7, wherein the timer is a clock generator.

9. The clock signal generator of claim 1, wherein the trigger signal is derived from the narrow-band clock signal using a clock divider, which is adapted to generate the trigger signal from the narrow-band clock signal supplied to the clock divider.

10. The clock signal generator of claim 1, further comprising
    a narrow-band clock generator adapted to generate the narrow-band clock signal, wherein the narrow-band clock generator is provided with at least one signal output, wherein the at least one signal output of the narrow-band clock generator is operatively coupled to the fractional clock divider to supply the narrow-band clock signal thereto.

11. The clock signal generator of claim 1, wherein the output clock signal has a width of a frequency spectrum spreading, which is defined by the divisor fraction signal with respect to the clock divisor signal.

12. The clock signal generator of claim 1, wherein the narrow-band clock signal has a low amount of jitter.

13. A method for generating a spread spectrum clock signal, comprising:
    generating, by a random number generator, a random number signal varying in time in accordance with a trigger signal, wherein the timely varying random number signal defines a divisor fraction signal;
    providing a clock divisor signal;
    mixing, by a signal mixer, the clock divisor signal and the timely varying random number signal to obtain a mixed divisor signal;
    providing a source clock signal, which is a narrow-band clock signal;
    generating an output clock signal from the source clock signal, wherein the frequency of the output clock signal has a frequency, which is substantially equal to the frequency of the source clock signal divided by a divisor represented by the mixed divisor signal; and
    outputting the output clock signal.

14. The method of claim 13, further comprising:

generating, by a clock divisor generator, the clock divisor signal, wherein the clock divisor generator is provided with at least one signal output, wherein the at least one signal output is operatively coupled to the signal mixer to supply the clock divisor signal thereto.

15. The method claim 14, wherein the clock divisor generator is a progressive clock switching divisor generator.

16. The method claim 13, wherein the random number generator is a pseudo-random number generator.

17. The clock signal generator of claim 16, wherein the pseudo-random number generator comprises a linear-feedback shift register.

18. The method of claim 13, further comprising:
triggering, by a timer, the random number generator to generate a new pseudo-random number signal, wherein the timer is provided with at least one signal output, wherein the at least one signal output of the timer is operatively coupled to the random number generator to supply the trigger signal thereto.

19. The method of claim 13, wherein the trigger signal is deriving the trigger signal from the narrow-band clock signal using a clock divider, the clock divider is adapted to generate the trigger signal from the narrow-band clock signal supplied to the clock divider.

20. The method of claim 13, further comprising:
generating, by a narrow-band clock generator, the narrow-band clock signal, wherein the narrow-band clock generator is provided with at least one signal output, wherein the at least one signal output of the narrow-band clock generator is operatively coupled to a fractional clock divider to supply the narrow-band clock signal thereto.

* * * * *